United States Patent [19]
Wilde et al.

[11] Patent Number: 5,684,612
[45] Date of Patent: Nov. 4, 1997

[54] METHOD AND SYSTEM FOR MAINTAINING AND CONTROLLING THE SIGNAL-TO-NOISE RATIO OF HOLOGAMS RECORDED IN FERROELECTRIC PHOTOREFRACTIVE MATERIALS

[75] Inventors: Jeffrey P. Wilde, Mountain View; Lambertus Hesselink, Woodside, both of Calif.

[73] Assignee: Board of Trustees of the Leland Stanford Junior University, Palo Alto, Calif.

[21] Appl. No.: 528,748

[22] Filed: Sep. 15, 1995

Related U.S. Application Data

[63] Continuation of Ser. No. 76,346, Jun. 11, 1993, abandoned.
[51] Int. Cl.$^6$ ........................................... G03H 1/02
[52] U.S. Cl. .................... 359/7; 359/3; 359/5; 359/25
[58] Field of Search .............................. 359/5, 6, 7, 10, 359/3, 25

[56] References Cited

U.S. PATENT DOCUMENTS

| | | | |
|---|---|---|---|
| 3,922,061 | 11/1975 | Glass et al. | 359/7 |
| 4,927,220 | 5/1990 | Hesselink et al. | 359/7 |
| 5,422,873 | 6/1995 | Kewitsch et al. | 359/2 |
| 5,440,669 | 8/1995 | Rakuljic et al. | 359/7 |

OTHER PUBLICATIONS

J. J. Amodei, et al.; "Improved Electooptic Materials and Fixing Techniques for Holographic Recording"; Feb. 1972; pp. 390–396 [*Applied Optics*, vol. 11, No. 2].

F. Micheron, et al.; "Electrical Control in Photoferroelectric Materials for Optical Storage"; Apr. 1974; pp. 784–787 [*Applied Optics*, vol. 13, No. 4].

J. B. Thaxter, et al.; "Unique Properties of SBN and Their Use in a Layered Optical Memory"; Apr. 1974; pp. 913–924 [*Applied Optics*, vol. 13, No. 4].

D. von der Linde, et al.; "Optical storage using refractive index changes induced by two-step excitation"; Jan. 1976; pp. 217–220 [*Journal of Applied Physics*, vol. 47, No. 1].

A. M. Glass; "The Photorefractive Effect"; Sep. –Oct. 1978; pp. 470–479 [*Optical Engineering*, vol. 17, No. 5].

Ratnakar R. Neurogaonkar, et al.; "Progress in Photorefractive tungsten bronze crystals"; Feb. 1986; pp. 274–282, [*J. Opt. Soc. Am. B.*, vol. 3, No. 2].

M. D. Ewbank, et al.; "Photorefractive properties of strontium–barium niobate"; Jul. 15, 1987; pp. 374–380, [*Journal of Applied Physics*, vol. 62, No. 2].

George C. Valley, et al.; "Photorefractive Materials"; 1988; pp. 165–188, [*Ann. Rev. Mater. Sci.*, vol. 18] no month.

Jian Ma, et al.; "Electrocontrolled beam coupling and bistable behavior in SBN:Ce crystals"; Sep. 5, 1988; pp. 826–827, [*Appl. Phys. Lett.*, vol. 53, No. 10].

Aharon Agranat, et al.; "Voltage–controlled photorefractive effect in paraelectric $KTa_{1-x}Nb_xO_3$:Cu, V"; Sep. 15, 1989; pp. 1017–1019, [*Optics Letters*, vol. 14, No. 18].

Lewis B. Aronson, et al.; "Photorefractive integrated–optical switch arrays in $LiNbO_3$"; Jan. 1, 1990; pp. 30–32, [*Optics Letters*, vol. 15, No. 1].

G. Montemezzani, et al.; "Thermal hologram fixing in pure and doped $KNbO_3$ crystals"; Dec. 1990; pp. 2323–2328, [*J. Opt. Soc. Am. B.*, vol. 7, No. 12].

George A. Rakuljic, et al.; "Volume holographic narrow–band optical filter"; Mar. 15, 1993; pp. 459–461, [*Optics Letters*, vol. 18, No. 6].

Jeffrey P. Wilde, et al.; "Electric–Field–Controlled Diffraction in Photorefractive Strontium Barium Niobate"; Jun. 15, 1992; pp. 853–855, [*Optical Letters*, vol. 17, No. 12].

Jeffrey P. Wilde; "Growth and Characterization of Strontium Barium Niobate Crystals for Multiplexed Photorefractive Holography"; Ph.D Thesis.

*Primary Examiner*—Paul M. Dzierzynski
*Assistant Examiner*—Darren E. Schuberg

[57] ABSTRACT

A hologram with a dynamically controlled diffraction efficiency and enhanced signal-to-noise ratio is recorded in ferroelectric photorefractive materials, such as strontium barium niobate ($Sr_xBa_{1-x}Nb_2O_6$) (SBN), BSTN, SCNN, PBN, BSKNN, $BaTiO_3$, $LiNbO_3$, $KNbO_3$, KTN, PLZT and the tungsten bronze family. The diffraction efficiency of the hologram is dynamically controlled by applying an electric field along the polar axis of the ferroelectric photorefractive recording medium. Electrically controlled diffraction is used in conjunction with hologram fixing and operation of the material at a temperature in the vicinity of or above its Curie temperature to additionally provide prolonged, low-noise readout. The general methods for recording and reconstructing a hologram (or a set of multiplexed holograms) using these techniques is disclosed. A plurality of configurations employing the improved hologram are disclosed, including an optical crossbar switch in guided-wave and free-space formats that can function as a component in a variety of parallel optical processing systems, a reconfigurable dynamic wavelength filter, and a page-based holographic data storage system.

76 Claims, 5 Drawing Sheets

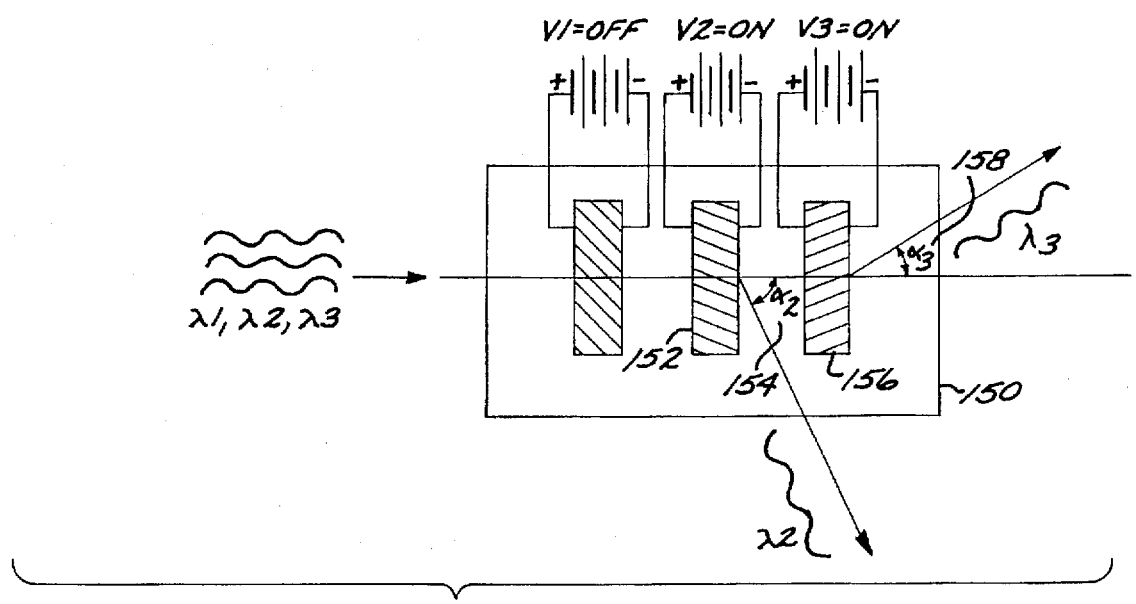
FIG. 10
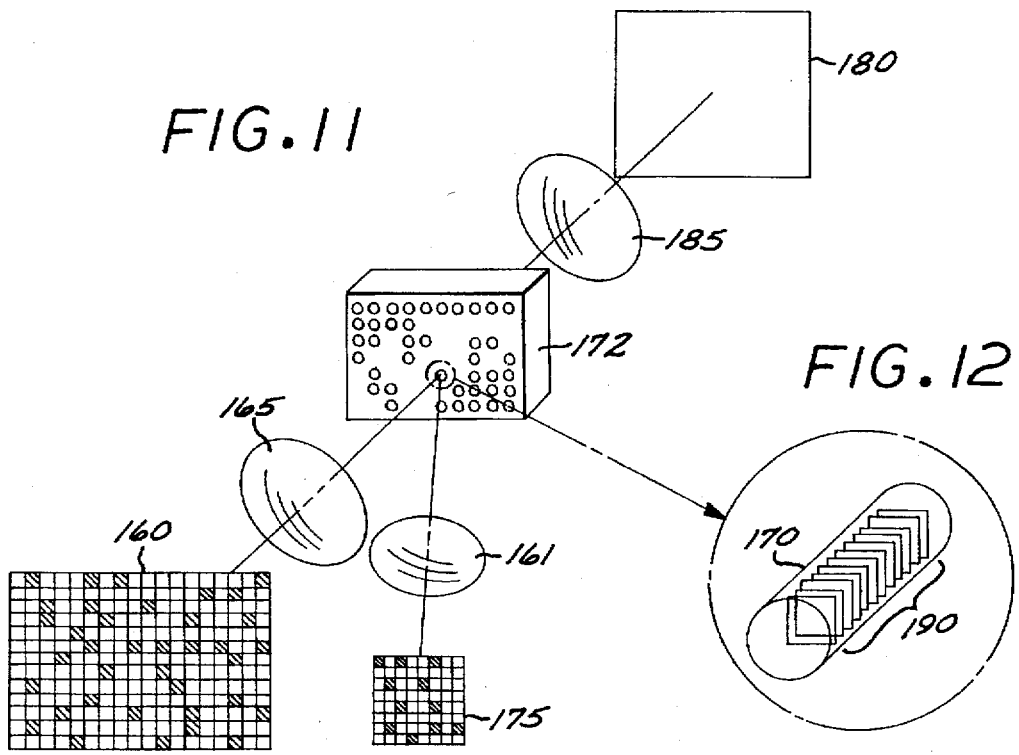
FIG. 11
FIG. 12

METHOD AND SYSTEM FOR MAINTAINING AND CONTROLLING THE SIGNAL-TO-NOISE RATIO OF HOLOGAMS RECORDED IN FERROELECTRIC PHOTOREFRACTIVE MATERIALS

This application is a continuation of application Ser. No. 08/076,346 filed Jun. 11, 1993, now abandoned.

BACKGROUND OF THE INVENTION

The present invention relates generally to the recording and readout of holograms in ferroelectric photorefractive materials such as strontium barium niobate ($Sr_xBa_{1-x}Nb_2O_6$, or simply SBN:x where $0.25 \leq x \leq 0.75$, the value of x denoting a specific composition), BSKNN ($Ba_{2-x}Sr_xK_{1-y}Na_yNb_5O_{15}$), BSTN ($Ba_{3-x}Sr_xTiNb_4O_{15}$), SCNN ($Sr_{2-x}Ca_xNaNb_5O_{15}$), PBN ($Pb_xBa_{1-x}Nb_2O_6$), $BaTiO_3$, $LiNbO_3$, $KNbO_3$, KTN ($KTa_{1-x}Nb_xO_3$), PLZT and the tungsten bronze ferroelectric family, and to a variety of techniques for maintaining and controlling such holograms. These holograms can be used, among other things, as diffractive elements to select, redirect and/or re-shape light beams, as well as for storing image information.

During the last several decades great strides have been made in information storage and processing. Rapid advancement of electronic technology has clearly been the dominant reason but various optical technologies have also made important contributions. The inherent strength of optics lies in its ability to efficiently transmit information over high bandwidth (temporal and spatial) channels. These channels can exist in guided-wave or free-space form. The manner in which these channels are routed from one place to another depends on the particular application at hand. Optical fibers are ideal for long haul communications and, more recently, are finding use in local area networks. On the other hand, holographic optical interconnects appear attractive for implementing the more complicated and densely packed connections that are required in parallel processors such as the Connection Machine. Free space optical signals can be routed with conventional bulk optics, but greater flexibility is afforded by using holographic elements. For example, many individual holograms can be multiplexed in the same recording volume to produce numerous point-to-point interconnections. The number of possible connections is directly linked to the storage capacity of the recording medium. Optical wave fronts can also carry high resolution spatial information. In this regard, holography provides a basis for efficiently storing and processing pages of two dimensional data for image correlation and pattern recognition applications through the use of holographic matched filters. Additionally, holographic data storage systems may some day significantly enhance the speed at which digital information is accessed and transferred, thereby overcoming current I/O bottlenecks in electronic computers and opening the door for a new generation of powerful multi-media applications.

Volume phase holograms can be recorded in photosensitive, electro-optic materials such as SBN by inducing a change of the refractive index of the material with light. Holograms are thus produced via the photorefractive effect. The photorefractive effect literally refers to the change in a material's refractive index caused by optical illumination. More specifically, the photorefractive effect describes a collection of physical processes which combine to permit the real-time recording of a spatially varying optical intensity pattern (often generated by the interference between two mutually coherent light waves) as a corresponding variation in the index of refraction of a suitable material. Such variations can be used to store information in the form of holograms.

Most photorefractives can be classified into one of three distinct classes—the ferroelectric oxides, the cubic oxides of the sillenite family, and the semi-insulating compound semiconductors. The ferroelectrics tend to possess large electro-optic coefficients and can therefore yield very high diffraction efficiencies; in many instances only the absorption loss keeps the efficiency from reaching 100%. They also offer long dark storage times and large dynamic range as required for the superposition, or multiplexing, of many holograms in the same volume. Ferroelectrics are characterized by a structural phase transition (occurring in the vicinity of the Curie temperature) where many of materials properties change markedly and become temperature and field dependent. In contrast to the ferroelectric oxides, both the cubic oxides (sillenites) and semiconductors tend to have large free-carrier mobilities, making them fairly sensitive in the optical and infrared bands, respectively. However, they tend to have short dark storage times and limited dynamic range.

Photorefractive materials have the ability to record holographic interference patterns in real time with a characteristic time constant that is essentially inversely proportional to the average incident optical intensity. However, this real-time response, albeit useful for in-situ recording, poses a problem in the sense that the holograms are also susceptible to erasure upon readout. Many applications require control over the optical sensitivity of the photorefractive medium so that multiplexed holograms can be recorded and erased upon demand, with nondestructive readout occurring until changes are required. Therefore, methods for fixing holograms in photorefractive materials to prevent optical erasure are of significant importance.

SUMMARY OF THE INVENTION

Generally, the present invention provides unique methods for enhancing, controlling and maintaining the signal-to-noise ratio (SNR) of holograms recorded in ferroelectric photorefractive materials. These methods can be applied to photorefractive recording media which most often take the form of bulk single crystals, single-crystal fibers, or an array of such crystals.

Dynamic control of the readout signal strength (signal strength being determined by the holographic diffraction efficiency) is achieved by means of an applied electric field when the crystal is maintained at a temperature in the vicinity of or above its ferroelectric phase transition temperature (i.e., the Curie temperature $T_c$). The diffraction efficiency η is defined as the intensity of the diffracted light divided by the intensity of the transmitted light in the absence of the hologram (this definition ignores losses due to absorption and surface reflections). Intrinsic scattering noise is also reduced for crystal temperatures above $T_c$. Furthermore, optical erasure of the hologram(s) can be prevented by employing an appropriate fixing technique, thereby producing a system that offers dynamically controlled diffraction in combination with low scatter noise and nondestructive readout. Preferably, fixing is achieved via thermal or two-photon processes, while readout with a Bragg-matched (or quasi-Bragg-matched) long-wavelength reference beam is also suitable for nondestructive hologram access.

The dynamic increase in the signal strength, or diffraction efficiency, is achieved by using electrically controlled diffraction (ECD). By the phrase "increasing the diffraction efficiency of a hologram" using ECD, it is understood that the comparison is being made with the diffraction efficiency of a hologram not subjected to ECD. Thus the present invention provides a method for selectively activating holograms to an enhanced diffraction efficiency state, thereby allowing the holograms to be selectively turned "on" and "off" in addition to continuous tuning of the diffraction efficiency between these two states. To obtain ECD, a ferroelectric photorefractive crystal such as SBN, preferably held at a constant temperature in the vicinity of or above its Curie temperature, is subjected to a uniform electric field, applied preferably along the polar crystallographic axis (e.g., the c-axis in SBN). The electric field may be spatially localized in order to activate only those holograms residing in a localized volume, or it may be applied to the entire recording volume, thereby simultaneously activating all of the multiplexed holograms. If a hologram has a diffraction efficiency of $\eta_o$ in the absence of an applied electric field E, then ECD can be used to increase the efficiency by an amount $\Delta\eta(E)$ so that the total diffraction efficiency becomes $\eta=\eta_o+\Delta\eta(E)$. The phrase "in the vicinity of or above" the Curie temperature is used here to indicate a temperature range over which the field-induced increase in the diffraction efficiency, $\Delta\eta T(E)$, of a hologram (measured during readout) is greater than or equal to 1% of its maximum field-enhanced value $\{\Delta\eta(E)\}_{max}$. This definition requires the total diffraction efficiency to be less than 100% so that over-coupling (a common term used in the art) does not occur and, in addition, it is understood that the photorefractive space-charge pattern comprising the hologram is unchanged during the readout process. This definition for the temperature range of interest is applicable to ferroelectric photorefractive materials possessing sharp or diffuse phase transitions.

If the ferroelectric photorefractive material is operated above its Curie temperature, there is the potential for an increased SNR due to a reduction in the level of scattering noise. Thus, the present invention also provides a method for reducing the noise sources that arise in the form of photorefractive beam fanning and Rayleigh scattering. For a crystal operated in the vicinity of or above its Curie temperature, ECD is also advantageous since little or no diffraction from a pre-recorded hologram will occur unless an electric field is applied to the crystal. If, in addition, these holograms have been appropriately fixed, then optical erasure of the holograms during readout can be greatly reduced or prevented. Therefore, when fixing is combined with ECD and an appropriate operating temperature in the vicinity of or above the Curie point, the result is a fast, dynamic control of the resulting diffraction efficiency with a greatly prolonged readout period and a much lower noise level when compared to systems that lack such techniques.

The present invention further provides a plurality of holographic systems employing the improved ferroelectric photorefractive media and techniques described above. In many of the embodiments disclosed herein, operation of a ferroelectric photorefractive medium at a temperature in the vicinity of or above its Curie temperature is used in conjunction with ECD and fixing.

In one embodiment of the present invention, a dynamic optical wavelength filter is disclosed. This type of filter has wide ranging applications, such as reconfigurable bandpass filtering and wavelength demultiplexing (by diffraction of specific wavelengths into different directions).

In yet another embodiment of the present invention, dynamic holographic optical interconnections are devised.

Such optical interconnects may exist in either guided-wave or free-space form. Reconfigurable optical interconnects have numerous applications, including use in optical switching systems for digital communications, matrix-vector multiplications in digital processing, neural network applications, and pattern recognition systems.

Many of the same features that make holography attractive for optical interconnect applications also apply to page-based digital data storage. Specifically, there exists the potential for systems with large capacity (tens of Gbytes) combined with low latency page access (on the order of microseconds) and high data transfer rates (tens of Gbits/sec). The field of holographic data storage is currently experiencing a resurgence of interest after earlier efforts in the 1970's failed to compete with magnetic technologies. This resurgence has been brought about by a growing need for higher performance storage devices that can overcome I/O bottlenecks in modern computing and telecommunication systems. Holographic storage now appears more feasible owing to recent advances in photorefractive materials and the enabling component technologies (compact solid-state lasers, spatial light modulators, and high-resolution CCD arrays). Thus another embodiment of the present invention discloses a storage device that employs a phase-coded reference beam to record two dimensional pages of digital data in a storage array comprised of photorefractive rods.

Other features and advantages of the present invention will become apparent from the following detailed description, taken in conjunction with the accompanying drawings, which illustrate, by way of example, the principles of the invention.

DESCRIPTION OF THE DRAWINGS

FIG. 10 is a schematic representation of a reconfigurable dynamic wavelength demultiplexer utilizing features of the present invention.

FIG. 11 is a schematic representation of a page-based holographic data storage system using an array of SBN rods utilizing features of the present invention.

FIG. 12 is an enlarged schematic view of one of the rods shown in FIG. 11.

DESCRIPTION OF THE PREFERRED EMBODIMENTS

One aspect of the present invention involves enhancing the diffraction efficiency of holograms which have been recorded in ferroelectric photorefractive materials by using electrically controlled diffraction (ECD). In the present invention, ECD is fundamentally based on the nonlinear electro-optic and dielectric properties that may be present in a photorefractive material under certain temperature conditions; it is implemented by applying an electric field to the material, preferably a uniform field along a ferroelectric polar axis (e.g., the c-axis in SBN). To clearly illustrate the principles of ECD, the specific case of SBN is treated herein, but in principle a wide variety of related ferroelectric photorefractive materials will exhibit ECD behavior similar to that of SBN and can therefore be operated in a similar fashion.

To begin with, bulk SBN crystals are grown by the Czochralski method, known per se, or any other suitable method such as Bridgman or Gradient Freeze. SBN crystals can also be grown in fiber form using the Laser-Heated Pedestal Growth (LHPG) technique or any other miniature growth technique. The crystals are doped in order to increase the optical absorption at the recording wavelength or range of wavelengths (typically 400-600 nm), thereby providing photorefractive charge trapping centers and substantially enhancing the photorefractive sensitivity over this spectral range. In SBN, photorefractive dopants known per se include Ce, Cr, Co, Fe, Ca, Mn, Mo, Mg, and Rh. Electrical contact is made to a crystal by using metal electrodes on the c-faces. In general, the electrodes may be patterned to provide spatially localized electric fields; the use of one pair of electrodes that entirely cover both c-faces (i.e., no patterning) is a specific example of the more general case. In the preferred embodiment, ECD is employed at a temperature in the vicinity of or above the ferroelectric phase transition temperature (i.e., Curie temperature $T_C$) of the crystal. Since SBN is a solid solution material, $T_C$ depends strongly on composition, ranging from 30° C. for SBN:75 to 200° C. for SBN:25. The congruently melting composition, SBN:61, has a Curie temperature of approximately 75° C.

Figure 1:
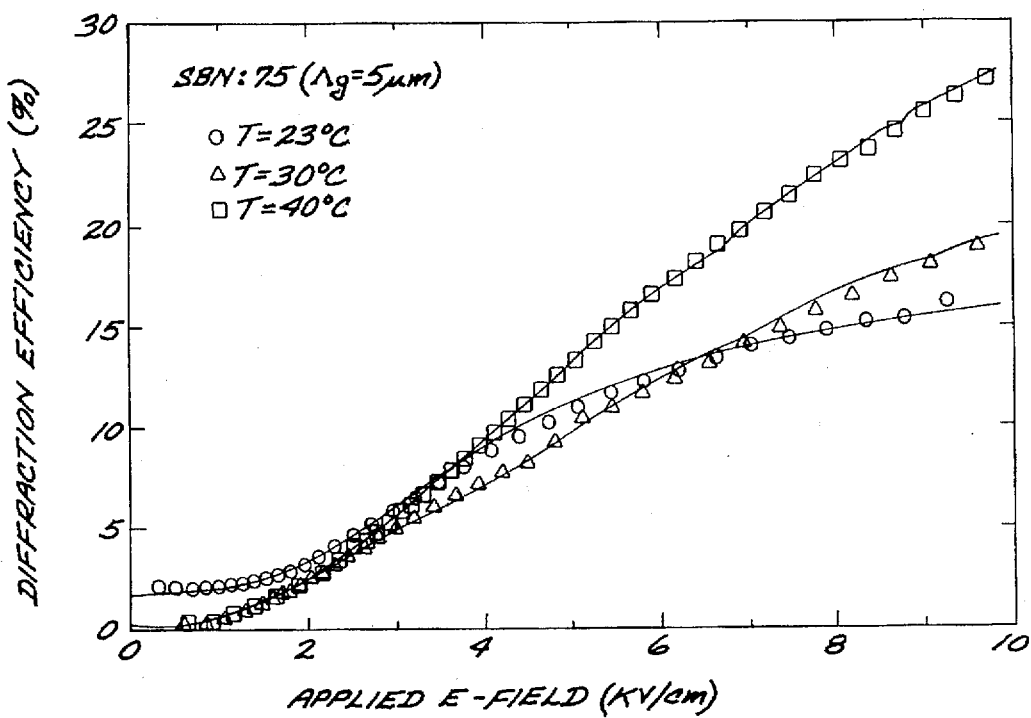
FIG. 1 is a graphical representation of diffraction efficiency versus an applied electric field for SBN:75.
Figure 2:
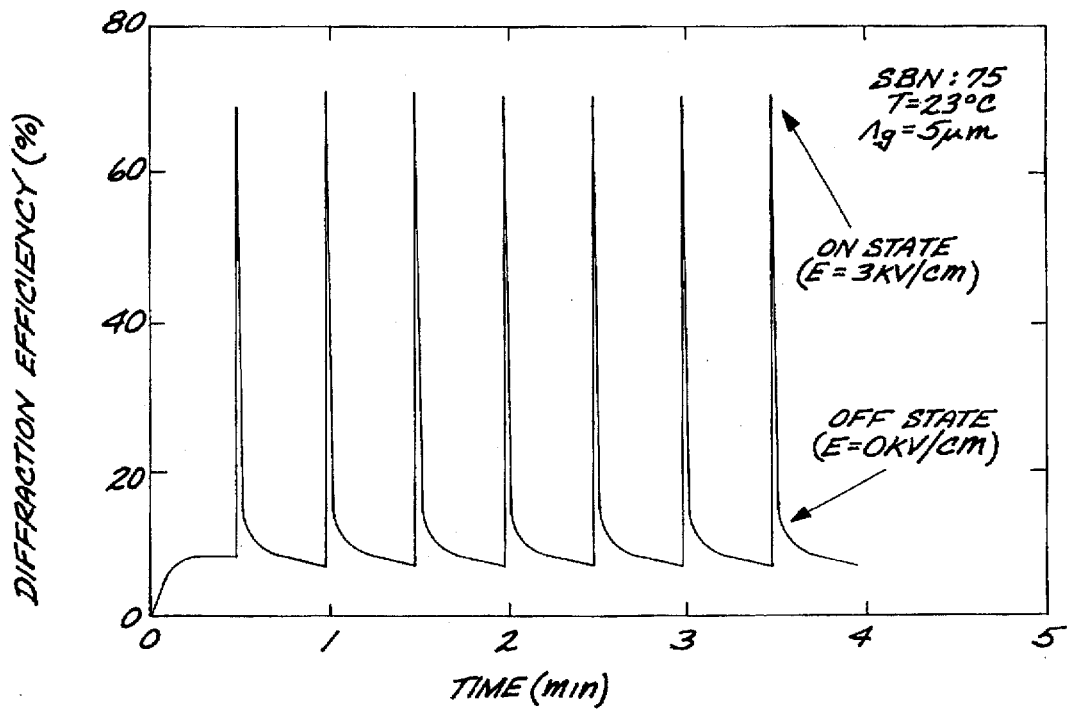
FIG. 2 is a graphical representation of electrically controlled "on" and "off" diffraction efficiency states for a hologram recorded in SBN:75.

Referring to FIG. 1, the effects of ECD are seen in the form of experimentally acquired data. FIG. 1 shows the readout diffraction efficiency plotted as a function of applied field for a planar grating (5 µm grating period) recorded with an exposure of 1.2 J/cm² in a crystal of SBN:75 (Ce-doped, 0.01 mol %) at various temperatures near $T_C$. It can be seen that the diffraction efficiency of a hologram subjected to ECD is significantly enhanced; at 40° C. the efficiency increases from near 0% to over 10% as an electric field of 4 kV/cm is applied. With this short recording exposure (i.e., well below the steady-state response), the efficiency at 10 kV/cm is seen to increase with temperature since the photorefractive sensitivity improves upon heating. Higher field-induced efficiencies, well over 50% at 3 kV/cm, can be obtained by first recording to steady state. From an applications perspective, ECD can be used to "activate" a hologram by significantly enhancing its diffraction efficiency. Thus, the hologram is turned "on" and "off" by the on and off switching of an applied electric field as shown in FIG. 2.

With regard to signal strength, the choice of operating temperature is significant because it strongly affects (1) the characteristics of ECD during readout and (2) the photorefractive sensitivity during recording. Generally speaking, the recording sensitivity improves with increasing temperature due to an increase in the mobility of the photorefractive charge carriers. However, with regard to optimizing ECD, it is desireable to keep the crystal temperature in the vicinity of or slightly above the Curie temperature because it is in this region that crystal lattice properties which significantly affect the diffraction efficiency, such as the small-signal linear electro-optic coefficient r(E,T) and dielectric constant ϵ(E,T), exhibit their strongest field dependence. In particular, for a given photorefractive space-charge field, the diffraction efficiency is proportional to r(E,T)/ϵ(E,T). In general, ECD is most pronounced when operating in the vicinity of or above the Curie temperature.

Figure 3:
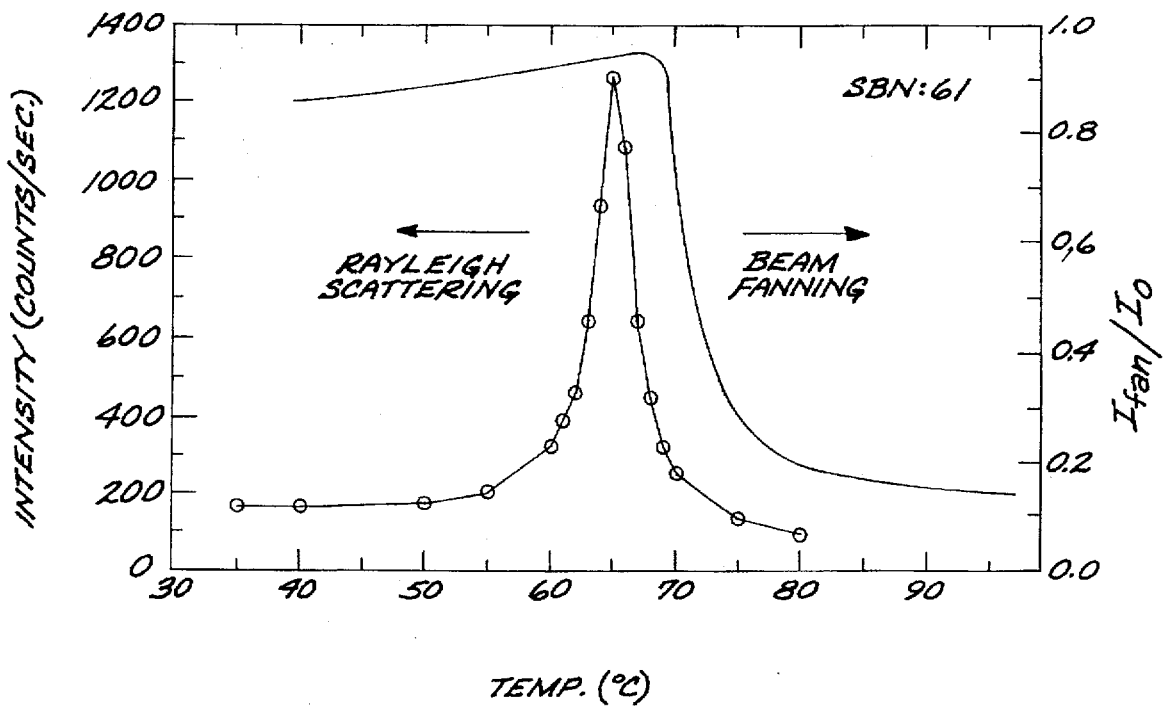
FIG. 3 is a graphical representation of optical scattering noise, namely Rayleigh scattering and photorefractive beam fanning, measured in SBN:61 as a function of temperature in the vicinity of the Curie temperature.

A second aspect of the invention involves temperature-dependent noise considerations and the role that the phase transition plays in this regard. It is noteworthy that operation of a ferroelectric photorefractive crystal at a temperature in the vicinity of or above its phase transition temperature is used not only for optimal ECD results, but also to provide a substantial reduction of scattering noise. For example, as shown in FIG. 3, when SBN:61 is heated to 85° C. (approximately 10° C. above its Curie temperature), photorefractive beam fanning is substantially reduced and Rayleigh scattering is minimal. These sources of noise degrade the signal-to-noise ratio (SNR) during readout of the hologram, so their reduction is quite beneficial.

Therefore, this invention, in part, serves to point out the role that the ferroelectric phase transition plays in determining the SNR for holograms recorded in ferroelectric photorefractive media; furthermore, it provides methods for enhancing and controlling the SNR based on the choice of operating temperature and the application of an electric field.

A third aspect of the present invention involves combining the temperature and electric field control of the holographic SNR discussed above with fixing of holograms recorded in ferroelectric photorefractive materials. In this invention, "fixing" is taken to mean any procedure by which nondestructive or quasi-nondestructive readout can be made to occur. In general, fixing may be obtained by, but not limited to (1) thermally-induced ionic transport, (2) thermal deactivation of a photorefractive trapping center, (3) recording via a two-photon charge transfer excitation, or (4) readout with a properly Bragg-matched long-wavelength beam to which the crystal is not photorefractively sensitive. By using a suitable fixing mechanism, readout of a hologram or a set of multiplexed holograms is greatly prolonged since optical erasure at the readout wavelength is minimized. Thus, a system employing fixing together with ECD and operation of a crystal at a temperature in the vicinity of or above its Curie temperature provides for dynamic control of the diffraction efficiency along with an extended readout, and gives an improved SNR.

The efficiency of a given fixing mechanism is very material dependent. As an example of the types of issues involved, thermal fixing in SBN via ionic transport is discussed here based on a theoretical model. Ionic fixing is best achieved with a properly doped SBN crystal. Properly doping the SBN crystal involves the introduction of a suitable ionic charge carrier such as $H^+$ (i.e., protons) or oxygen vacancies. This may be done during crystal growth or, alternatively, by a high-temperature post-growth treatment. The ionic charge carriers should not be affected by optical radiation in the spectral region of interest, typically the visible and near infrared regions; however, they should be affected by electrical driving forces at elevated temperatures. At the readout operating temperature, the ions should have a very low mobility so that they undergo negligible transport and are essentially pinned at their lattice positions.

Figure 5:
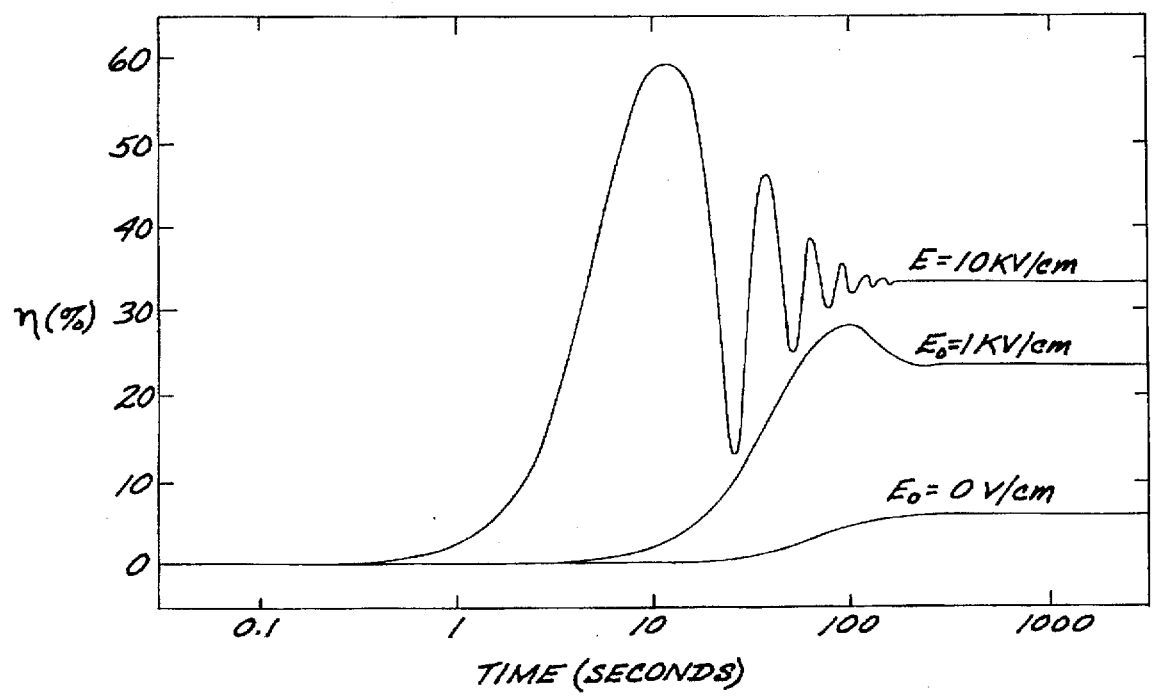
FIG. 5 is a graphical representation of the diffraction efficiency as a function of time during revelation of an ionic grating that has been thermally fixed in the medium of FIG. 4.

Thermal fixing may be achieved in a properly doped SBN crystal by (1) heating the crystal to a temperature in the range of 50° to 250° C., (2) recording a hologram so that both a photorefractive space charge pattern and a complementary ionic pattern are established in the crystal, (3) cooling back to room temperature to pin the ionic pattern in place, and (4) illuminating the crystal (with a possible applied field, for example as shown in FIG. 5 herein) to erase, at least partially, the photorefractive space charge pattern, thereby revealing the ionic pattern which resists optical erasure. This particular approach to thermal fixing is meant to be exemplary and is not the only one that can be used. For example, ionic fixing can also be carried out by first recording and then heating, but this approach is generally not believed to be as effective as recording at elevated temperatures, in terms of the resulting diffraction efficiency of the fixed hologram. However, when dealing with image storage, it may be preferable to first record at the desired readout temperature and then heat, in order to obtain higher fidelity image reconstruction at the expense of lower diffraction efficiency. This procedure yields higher fidelity because the index of refraction is temperature dependent, and strict Bragg matching requires the refractive index during readout to be equal to that of the medium during recording. In addition, Bragg mismatch due to thermal expansion is eliminated.

Figure 4:
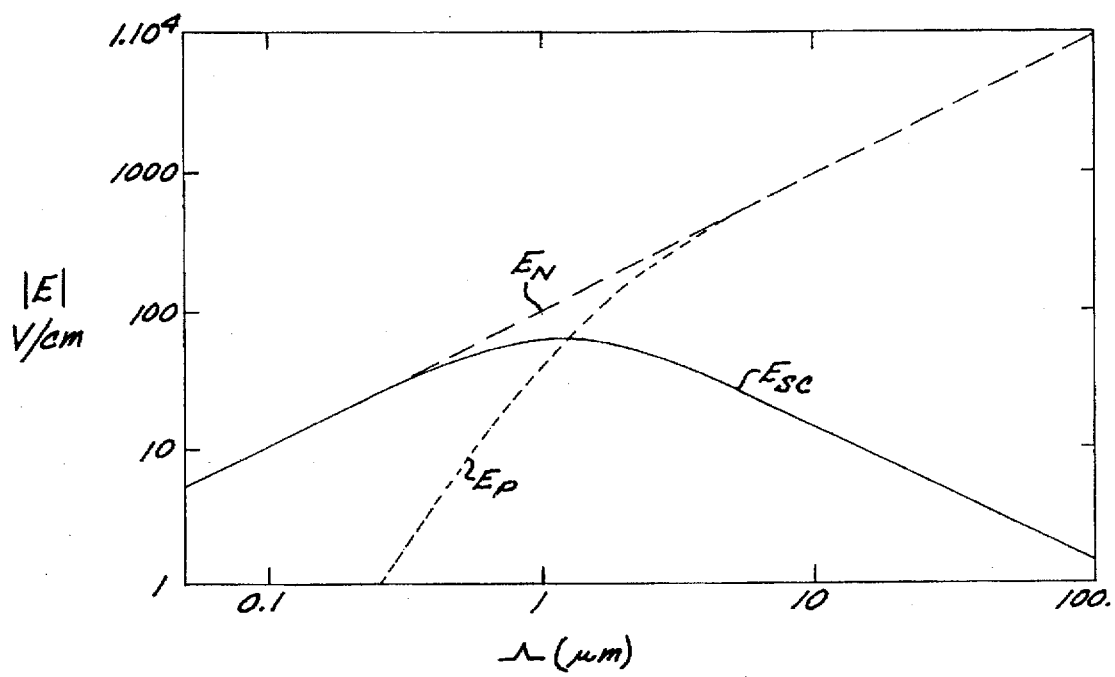
FIG. 4 is a graphical representation of the projected steady-state amplitude of ionic and electron gratings as a function of grating spacing for thermal fixing in a crystal of SBN:60.

Turning attention now to FIGS. 4 and 5, the results of a theoretical model describing thermal fixing in SBN:60 are shown. Protons are assumed to be the ionic carriers, though the model parameters can be easily adjusted to accommodate other ions (instead of protons) as well as any other ferroelectric photorefractive crystal host. The proton concentration of the crystal, $P_0$, is assumed to be about ten times larger than the photorefractive acceptor density, $N_A$. The grating is written at an elevated temperature at which the protons are mobile ($\mu_P$ is not equal to 0). For a large grating period, the proton and electron grating screen each other, resulting in a proton grating which is only limited by the proton or acceptor concentration. After recording, the temperature is reduced in the dark to fix the proton grating ($\mu_P$=0). The proton grating is then partially revealed with uniform optical illumination. The application of an electric field during readout improves the revelation of the proton grating, thereby increasing the "fixed" diffraction efficiency.

FIG. 4 shows the steady state amplitude of the proton and electron grating ($E_P$ and $E_N$, respectively) and their sum ($E_{SC}$), which is the observable space charge field, as a function of the grating period. FIG. 5 shows the diffraction efficiency as a function of time during revelation of a fixed proton grating, with various applied electric fields. Note that the larger the applied field, the greater the diffraction efficiency of the fixed grating during steady-state readout.

Data for the plots of FIGS. 4 and 5 assume that the material is an SBN:60 crystal with the following properties: $S_e$=0.403 cm$^2$J, $\beta$=0.0 s$^{-1}$, $\gamma_c$=5.0×10$^{-8}$ cm$^3$ s$^{-1}$, $\mu_c$=0.10 cm$^2$ V$^{-1}$ s$^{-1}$, $N_D$=8.30×10$^{16}$ cm$^{-3}$, $N_A$=0.42×10$^{16}$ cm$^{-3}$, $p_o$=4.00×10$^{16}$ cm$^{-3}$, absorption=0.10 mm$^{-1}$, n=2.3, $\epsilon$=1100, $r_{eff}$=100 pm/V, crystal length=5 mm, wavelength=515 nm, grating period=5 µm. During grating recording (at elevated temperature): $\mu_P$=0.3×10$^{-5}$ cm$^2$ V$^{-1}$ s$^{-1}$, $I_{reference}$=500 mW/cm$^2$, $I_{signal}$=500 mW/cm$^2$, $E_0$=0 kV/cm. During readout (at reduced/room temperature): $\mu_P$=0.0 cm$^2$ V$^{-1}$ s$^{-1}$, $I_{reference}$=500 mW/cm$^2$, $I_{signal}$=0 mW/cm$^2$, $E_0$=0, 1 or 10 kV/cm.

Fixing can also be accomplished by using a recording material which is doped in such a way as to provide a photorefractive impurity center possessing a two-photon charge transfer transition. In this case, photoexcitation of a photorefractive charge carrier into the conduction band involves the absorption of two separate photons, thereby making the initial photorefractive response rate $\Gamma$ a nonlinear function of the incident light intensity. In particular, if the transition occurs with two photons of the same wavelength, then $\Gamma$ is proportional to the square of the total incident intensity at this wavelength; if it occurs with two photons of different wavelengths, then $\Gamma$ is proportional to the product $I_1 I_2$ where $I_1$ is the intensity of the light at the first wavelength, $\lambda_1$, and $I_2$ is the intensity of the light at the second wavelength, $\lambda_2$. Therefore, in the first case (equal wavelength photons), quasi-nondestructive readout takes place when using a readout beam having an intensity much lower than that of the average recording intensity. Although similar behavior occurs in the conventional single-photon photorefractive effect, the nonlinear response rate associated with two-photon recording significantly enhances the fixing process. When the two photons have different wavelengths, the light at $\lambda_1$ can be used to form the interference pattern, while light at $\lambda_2$ controls the recording sensitivity. So recording of the interference pattern formed by $\lambda_1$ takes place only in the presence of the $\lambda_2$ control beam, and nondestructive readout at $\lambda_1$ occurs in the absence of the $\lambda_2$ control beam.

When ECD is used in combination with a suitable fixing technique and operation of the crystal in the vicinity of or above its Curie temperature, the result is dynamic electrical control of the diffraction efficiency with a prolonged, low-noise readout. In this manner, SBN and other ferroelectric photorefractive materials can be used for a wide variety of holographic applications.

Figure 6:
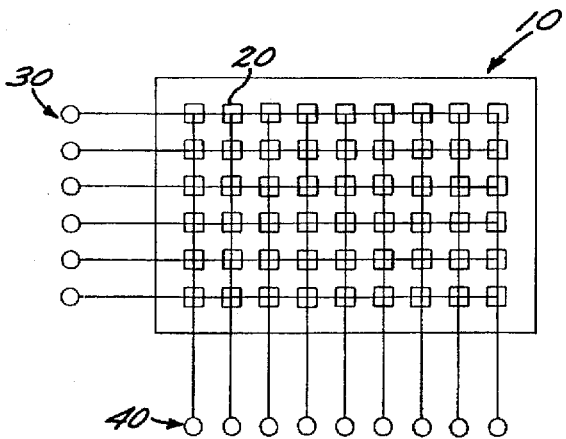
FIG. 6 is a schematic view of a general crossbar switch that provides general interconnections between a set of input and output channels.

Turning attention now to FIGS. 6, there is shown the general representation of an N×M crossbar switch which serves to connect a set of N input channels 30 to a set of M output channels 40 by means of weighted interconnection nodes 20. For holographic implementation of the crossbar switch, the signal-carrying leads 30, 40 correspond to discrete optical channels propagating in either guided-wave or free-space formats, while the interconnection nodes 20 are formed by using holographic gratings. A holographic crossbar can be used as a general switch in telecommunication and related systems as well as in a parallel network for performing matrix-vector multiplications as needed to implement FFT, associative memory, and other computational algorithms that utilize matrix or tensor operations.

Figure 7:
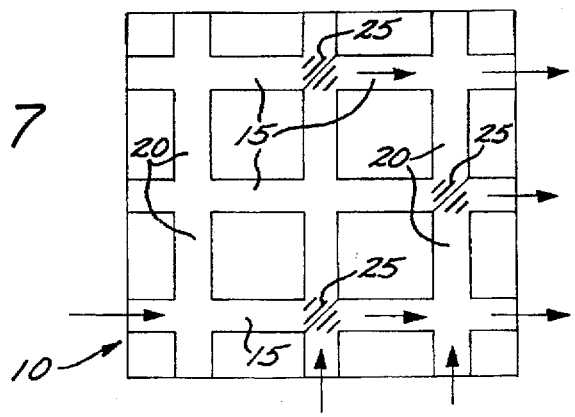
FIG. 7 is a graphical representation of an integrated optical crossbar switch utilizing features of the present invention.

In the embodiment of FIG. 7, there is shown a portion of the crossbar switch 10, optically implemented in a waveguide format. A plurality of channel waveguides 15, 20 exist in a suitable substrate, preferably comprised of SBN or any other suitable substrate, preferably comprised of SBN or any other suitable ferroelectric photorefractive material. The waveguides may be formed using standard techniques such as ion implantation or in-diffusion. In general, the waveguides should exhibit low absorption and low propagation loss, except at each crossing intersection 25, where they are purposely doped (e.g., with cerium if SBN is used) to provide an enhanced photorefractive sensitivity. At each intersection, a photorefractive diffraction grating is recorded, preferably by interfering the two corresponding guided waves that cross at the intersection. In this way, optimal Bragg matching is obtained for diffraction from one waveguide into another. Alternatively, the gratings may be formed by masking the substrate in such a way as to reveal only the crossing intersections and then illuminating the intersections from above with two appropriately oriented, mutually coherent writing beams. The resulting interference pattern then simultaneously produces all the necessary diffraction gratings with the proper orientation and grating spacing.

A given switching pattern can be implemented by using ECD as previously described herein to electrically activate the appropriate gratings. Those gratings not activated produce little or no diffraction. In this way, selected gratings can be turned on at different intersections to form any given input-to-output switching configuration. To this end, intersections 25 are fabricated with electrodes, thereby allowing electric fields to be appropriately applied. The application of the electric fields requires a suitable voltage source, and the switching configuration may be controlled by a computer or microprocessor. A microprocessor may be used in conjunction with any of the disclosed embodiments of the present invention. Optical erasure of the diffraction gratings can be prevented by using any of the fixing methods disclosed herein, or by any other form of fixing. In addition, the substrate is preferably operated at a temperature slightly above the Curie temperature, as disclosed herein, to enhance the signal-to-noise ratio.

Furthermore, when using ECD, it may be possible to vary the diffraction efficiency of each grating by varying the strength of the applied electric field in such a manner as to assign a weighted value to each interconnection node. It is then mathematically convenient to represent the input as an N-dimensional vector $V_{in}$ and the output as an M-dimensional vector $V_{out}$, with the two related via an M-by-N interconnection matrix W as follows:

$$V_{out} = W*V_{in}, \text{ where}$$

$$W = \begin{pmatrix} w_{11} & \cdots & w_{1N} \\ \cdot & & \cdot \\ \cdot & & \cdot \\ \cdot & & \cdot \\ w_{M1} & \cdots & w_{MN} \end{pmatrix}$$

$$V_{out} = \begin{pmatrix} y_1 \\ \cdot \\ \cdot \\ \cdot \\ y_M \end{pmatrix} \quad V_{in} = \begin{pmatrix} x_1 \\ \cdot \\ \cdot \\ \cdot \\ x_N \end{pmatrix}$$

The numerical value or weight of each element in W is determined by the diffraction efficiency of the corresponding grating, while each input/output vector element is given by the intensity of its corresponding optical wave. This mode of operation has obvious potential as an optical method for efficiently performing matrix-based computations.

Figure 8:
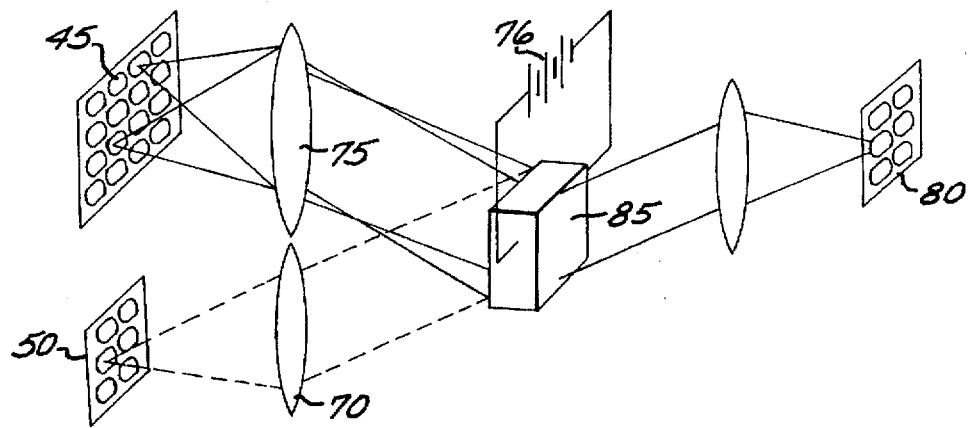
FIG. 8 is a schematic representation of an optical implementation of a free-space N×M crossbar interconnection using multiplexed volume holograms in accordance with the present invention.

A free-space version of the holographic crossbar is disclosed in FIG. 8. In this implementation, an N×M crossbar interconnect is comprised of an input plane 45 having N discrete optical sources, an output plane 80 having at least M discrete detector elements, and a volume holographic element 85 that connects the input to the output. An additional recording plane 50 having M optical sources is required to form the interconnect. After the sources are collimated by lenses 70 and 75, the interconnection gratings are recorded as the interference between these beams. Thus, some degree of mutual coherence is needed between planes 45 and 50, the simplest case being that of complete mutual coherence between all of the sources, although other possibilities (e.g., row- or column-based coherence) may be used to preclude the formation of unwanted gratings. A particular connection pattern is generated by recording the corresponding set of gratings which, upon readout, diffracts light from the input plane 45 to the output plane 80. It is possible to treat the input and output arrays as matrices which are linked by an interconnection tensor of rank four. Once again, as with the FIG. 7 embodiment, the holographic material 85 is preferably in the form of an SBN or any other suitable ferroelectric photorefractive crystal.

A distinction between the optical interconnect of FIG. 8 and that of FIG. 7 concerns the manner in which the gratings are multiplexed. In the free-space approach of FIG. 8, a plurality of gratings are superimposed throughout the entire recording volume in an angularly multiplexed manner, whereas in the guided-wave implementation of FIG. 7, each grating is spatially isolated and can be individually activated by ECD. With the free-space holographic crossbar, ECD (augmented by fixing and operation slightly above the Curie temperature) is preferably used to activate the complete set of multiplexed holograms by applying an electric field to the entire recording volume by use of a voltage source 76 acting through electrodes connected to the crystal faces along the polar crystallographic axis. In this case, the individual holograms are distinguishable by the high angular selectivity characteristic of volume holograms. Other forms of multiplexing, such as phase encoding or wavelength multiplexing, may also be used, as is known per se in the art.

Figure 9:
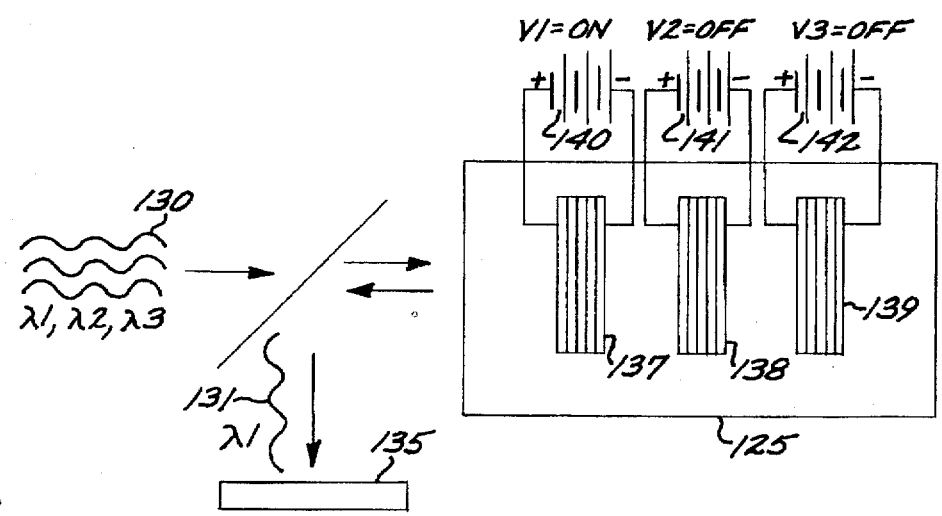
FIG. 9 is a schematic representation of a reconfigurable dynamic wavelength filter utilizing features of the present invention.

Yet another embodiment of the present invention comprises a dynamic wavelength filter. This type of filter can be utilized in a number of different application areas including high-resolution spectroscopy, remote sensing, and optical communications. As shown in FIG. 9, narrow-band optical filtering is realized by means of reflection volume holograms. The full-width, half-maximum spectral bandwidth of a reflection volume hologram can be quite narrow, in the vicinity of 0.01 nm for a 1 cm thick crystal. Dynamic multiline operation is achieved by using ECD in combination with multiple reflection holograms. In this embodiment, as with the embodiment of FIG. 4, only certain portions of the holographic recording medium, preferably an SBN or other suitable ferroelectric photorefractive crystal, are selectively enhanced by the application of a localized electric field along the polar crystallographic axis. The field is only applied to that portion of the crystal storing the hologram or set of holograms which are to be activated.

In FIG. 9, storage medium 125 contains a plurality of holograms 137–139 that are preferably fixed to resist optical erasure during use. There are shown three crystal array elements with one hologram stored in each element, though in general any number of array elements with multiple holograms per element may be used. Each hologram in FIG. 9 is Bragg matched to a specific wavelength ($\lambda_1$, $\lambda_2$, $\lambda_3$, . . . etc.). These particular wavelengths can be dynamically separated from incoming broadband radiation 130 by using ECD to activate those holograms corresponding to the wavelengths of interest. For example, if only the hologram 137 which is Bragg matched to $\lambda_1$ is activated (as shown in FIG. 9), then light within a very narrow wavelength band (approximately 0.01 nm) centered at $\lambda_1$ 131 is re-directed so as to fall on a detector 135, while all other wavelengths pass through the system. Thus crystal 125 acts as a reconfigurable wavelength filter that is electrically controlled to separate any number of narrow-band optical or near-infrared signals from the incoming radiation. The storage medium 125 may be operated at a temperature in the vicinity of or above its Curie temperature to increase the overall signal-to-noise ratio. The voltage source(s) 140–142 control each hologram through electrodes connected to the crystal faces.

In another embodiment of the dynamic wavelength filter, the holograms are recorded so as to spatially separate the various wavelength bands that are contained in the incoming beam. Thus, as shown in FIG. 10, an SBN or other suitable ferroelectric photorefractive crystal 150 contains a hologram 152 which is Bragg matched to a particular wavelength $\lambda_2$. When activated by ECD, this hologram deflects incoming light in a narrow spectral band around $\lambda_2$ at an angle $\alpha_2=154$, while light of any other wavelength passes undeflected. Likewise, another hologram 156 can deflect another wavelength $\lambda_3$ by an angle $\alpha_3=158$. Thus, crystal 150 acts as a dynamic wavelength demultiplexer, having reconfigurable angles of diffraction and permissible wavelengths. As before, a plurality of holograms may be stored for a plurality of permissible angles of diffraction and wavelengths, each activated by suitable electrodes from a voltage source. The holograms stored in crystal 150 may be fixed and operated at a temperature in the vicinity of or above the Curie temperature to increase the overall signal-to-noise ratio.

Turning attention now to the embodiment of FIG. 11, there is shown a holographic data storage device. The storage medium is comprised of an array of small photorefractive rods (fibers, bulk crystallites, or any other spatially partitioned photorefractive medium). In FIG. 11, a plurality of holograms is stored in each rod using phase encoding. Alternatively, a bulk single crystal (typically cut in the shape of a cube, slab, disk or general parallelepiped) can be used as a recording medium. In addition, other techniques for volume hologram multiplexing, such as angular or wavelength encoding, can be used in place of phase encoding. The diffraction efficiency of the holograms stored in each photorefractive rod can be enhanced by ECD as well as by fixing for prolonged readout. In addition, the recording medium can be maintained at a temperature in the vicinity of or above its Curie temperature to increase the signal-to-noise ratio during readout.

In FIG. 11, the data to be stored is impressed onto an optical wavefront by means of a spatial light modulator (SLM) that produces a two-dimensional binary bit pattern 160. A lens 165 is used to focus the optical Fourier transform of the data page into a small photorefractive rod 170 made preferably of SBN or any other suitable ferroelectric photorefractive material. A plurality of such rods comprises a storage array 172. A hologram of the data page is formed by simultaneously focusing a coded reference beam into the rod. The code is displayed on SLM 175 via lens 161 and serves as a page identification, thereby allowing multiple pages to be superimposed in the same rod and subsequently reconstructed on a CCD array 180 after passing through an inverse optical Fourier transform lens 185. The use of Fourier holography provides immunity to small defects in the recording material since any local perturbation in the Fourier domain is distributed throughout the entire image after inverse transforming. A set of multiplexed pages stored in a single rod is referred to as a stack, as indicated in FIG. 12 by stack 190. A multiple stack memory is formed by casting an array 172 of photorefractive rods 170 in a lower refractive index substrate so that light injected into any given rod stays confined to that rod. The different stacks are addressed by steering the object and reference beams to the appropriate rod location.

In general, there are a variety of reference beam encoding schemes that can be employed to multiplex holograms. The most common approach is to record each page with a plane-wave reference beam oriented at a specific angle and rely on the narrow angular selectivity that is characteristic of volume holograms. The more general technique of phase encoding shown in FIG. 11 can be used with either thin or thick recording media. In this case the reference wavefront has a fixed average angle of incidence for any given stack, but it is encoded with a binary phase pattern as depicted in reference number 175. Multiple pages within a stack are stored using an orthogonal set of phase codes. Lastly, a tunable laser can be used to record wavelength-multiplexed holograms, and, when combined with phase encoding, can lead to a very large storage capacity.

The primary parameters of interest in comparing mass storage systems are the total capacity, the random access latency and average sustained data transfer rate. In a holographic system the capacity is principally determined by the size and dynamic range of the recording medium. Taking $N_P$ to be the number of pages/stack, $N_S$ to be the total number of stacks, and $N_0$ being the number of bits per page, the capacity C equals $N_0 N_P N_S$ bits. If the rod diameter is about 1 mm, and the array of rods has dimensions of 2×2 cm, we then have $N_S=400$ stacks. The number of pages per stack can vary over a wide range, depending on the particular material used, but a reasonable estimate is $N_P=50$. The actual number of pages per stack depends on the required bit error rate or signal-to-noise ratio for the application of interest. If $N_0$ is 256K bits/page, then the capacity C is 5.12 Gbits or 640 Mbytes for this size medium.

The random access latency and data transfer rates depend on the capabilities of the spatial light modulator, the beam deflector, and the CCD array. It is presently believed that latencies in the microsecond range and transfer rates in the neighborhood of a Gbyte/sec are feasible.

By way of example and not by way of limitation, the performance specifications of a hypothetical holographic data storage system can be summarized by the following table.

| Parameter | Target Value(s) |
| --- | --- |
| Page Size | 256K bits |
| Pages/Stack | 40 to 60 |
| Stacks/Module | 400 |
| Storage Module | |
| Size | 2 cm × 2 cm × 0.5 cm |
| Capacity | 500 Mbytes to 1 Gbyte |
| Medium | SBN |
| Page read time | 10 µsec |
| Data transfer | 100 MB/sec to 1 Gbyte/sec |
| Page write time | 100 to 500 msec |
| Packaging | 5¼ inch peripheral |

While specific embodiments of the invention have been described in detail, it will be appreciated by those skilled in the art that various modifications to the structure and use of the disclosed invention may be made in light of the overall teachings of the disclosure, without departing from the scope of the invention as defined by the appended claims.

What is claimed is:

1. A hologram with improved diffraction efficiency and readout characteristics, comprising:

a ferroelectric photorefractive recording medium having an optical interference pattern recorded therein which modulates the index of refraction of said recording medium, said refractive index modulation being fixed in said recording medium to substantially maintain the space-charge field during readout, said recording medium being maintained at a temperature in the vicinity of or above the ferroelectric phase transition temperature during readout; and an electric field selectively applied to said recording medium during readout for selectively altering said index of refraction of said medium, and thereby increasing the diffraction efficiency of said hologram.

2. The hologram of claim 1, wherein said recording medium is a ferroelectric crystal, and said electric field is applied along the polar axis of said crystal.

3. The hologram of claim 1, wherein said refractive index modulation is fixed by elevating the temperature of said medium.

4. The hologram of claim 3, wherein said temperature lies in the range of 50°250° C.

5. The hologram of claim 3, wherein said medium is doped with an ion to promote said fixing.

6. The hologram of claim 5, wherein said ion is a proton, and said fixing is achieved by elevating said temperature of said medium to the range of 50°–250° C.

7. The hologram of claim 1, wherein said refractive index modulation is fixed by cooling said medium through a solid-solid phase transition to deactivate one or more photorefractive impurity center.

8. The hologram of claim 1, wherein said refractive index modulation is fixed by utilizing a two-photon charge transfer excitation.

9. The hologram of claim 1, wherein said refractive index modulation is fixed by using a readout beam that has a wavelength in a spectral region for which said recording medium is not photosensitive.

10. The hologram of claim 10, wherein said recording medium is at least one doped ferroelectric, said ferroelectric selected from the group consisting of SBN ($Sr_xBa_{1-x}Nb_2O_6$), BSKNN ($Ba_{2-x}Sr_xK_{1-y}Na_yNb_5O_{15}$), BSTN ($Ba_{3-x}Sr_xTiNb_4O_{15}$), SCNN ($Sr_{2-x}Ca_xNaNb_5O_{15}$), PBN ($Pb_xBa_{1-x}Nb_2O_6$), $BaTiO_3$, $LiNbO_3$, $KNbO_3$, KTN ($Kta_{1-x}Nb_xO_3$), PLZT, and other ferroelectrics having a tungsten bronze crystal structure.

11. The hologram of claim 10, wherein said ferroelectric is doped with at least one photorefractive ion.

12. The hologram of claim 11, wherein said dopants are selected from the group consisting of Ce, Cr, Co, Fe, Ca, Mn, Mo, Mg, Rh, any other suitable rare earth ions, and transition metal ions.

13. A hologram with improved diffraction efficiency and readout characteristics, comprising:

a ferroelectric photorefractive recording medium having an optical interference pattern recorded therein which modulates the index of refraction of said recording medium, an electric field selectively applied to said recording medium during readout, for selectively altering said index of refraction, and thereby increasing the diffraction efficiency of said hologram; and, the temperature of said recording medium being maintained at a temperature in the vicinity of or above the ferroelectric phase transition temperature of said medium during readout.

14. The hologram of claim 13, wherein said recording medium is a ferroelectric crystal, and said electric field is applied along the polar axis of said crystal.

15. The hologram of claim 13, wherein said refractive index modulation is fixed in said recording medium to substantially maintain the space-charge field during readout.

16. The hologram of claim 15, wherein said refractive index modulation is fixed by elevating the temperature of said medium.

17. The hologram of claim 16, wherein said temperature lies in the range of 50°–250° C.

18. The hologram of claim 16, wherein said medium is doped with an ion to promote said fixing.

19. The hologram of claim 18, wherein said ion is a proton, and said fixing is achieved by elevating said temperature of said medium to the range of 50°–250° C.

20. The hologram of claim 15, wherein said refractive index modulation is fixed by cooling said medium through a solid-solid phase transition to deactivate at least one photorefractive impurity centers.

21. The hologram of claim 15, wherein said refractive index modulation is fixed by utilizing a two-photon charge transfer excitation.

22. The hologram of claim 15, wherein said refractive index modulation is fixed by using a readout beam that has a wavelength in a spectral region for which said recording medium is not photosensitive.

23. The hologram of claim 13, wherein said recording medium is a doped ferroelectric, said ferroelectric selected from the group consisting of SBN ($Sr_xBa_{1-x}Nb_2O_6$), BSKNN ($Ba_{2-x}Sr_xK_{1-y}Nb_5O_{15}$), BSTN ($Ba_{3-x}Sr_xTiNb_4O_{15}$), SCNN ($Sr_{2-x}Ca_xNaNb_5O_{15}$), PBN ($Pb_xBa_{1-x}Nb_2O_6$), $LiNbO_3$, $BaTiO_3$, $KnbO_3$, KTN ($Kta_{1-x}Nb_xO_3$), PLZT, and other ferroelectrics having a tungsten bronze crystal structure.

24. The hologram of claim 23, wherein said ferroelectric is doped with at least one photorefractive ion.

25. The hologram of claim 24, wherein said dopants are selected from the group consisting of Ce, Cr, Co, Fe, Ca, Mn, Mo, Mg, Rh, all other suitable rare earth ions, and transition metal ions.

26. A method for producing a holographic recording medium with improved diffraction efficiency and readout characteristics, comprising:

fixing a hologram in said medium;

applying an electric field to said medium during readout; and operating said medium during readout at a temperature in the vicinity of or above the Curie temperature of said medium.

27. The method of claim 26, wherein said recording medium is a ferroelectric crystal, and said electric field is applied along the polar axis of said crystal.

28. The method of claim 26, wherein said fixing is carried out by elevating the temperature of said medium.

29. The method of claim 28, wherein said temperature lies in the range of 50°–250° C.

30. The method of claim 28, wherein said medium is doped with an ion to promote said fixing.

31. The method of claim 30, wherein said ion is a proton, and said fixing is achieved by elevating said temperature of said medium to the range of 50°–250° C.

32. The method of claim 26, wherein said fixing is carried out by cooling said medium through a solid-solid phase transition to deactivate at least one photorefractive impurity center.

33. The method of claim 26, wherein said fixing is carried out by utilizing a two-photon charge transfer excitation.

34. The method of claim 26, wherein said fixing is carried out by using a readout beam that has a wavelength in a spectral region for which said recording medium is not photosensitive.

35. The method of claim 26, wherein said recording medium is a doped ferroelectric, said ferroelectric selected from the group consisting of SBN ($Sr_xBa_{1-x}Nb_2O_6$), BSKNN ($Ba_{2-x}Sr_xK_{1-y}Nb_5O_{15}$), BSTN ($Ba_{3-x}Sr_xTiNb_4O_{15}$), SCNN ($Sr_{2-x}Ca_xNaNb_5O_{15}$), PBN ($Pb_xBa_{1-x}Nb_2O_6$), $LiNbO_3$, $BaTiO_3$, $KNbO_3$, KTN ($Kta_{1-x}Nb_xO_3$), PLZT, and other ferroelectrics having a tungsten bronze crystal structure.

36. The method of claim 35, wherein said ferroelectric is doped with photorefractive ion.

37. The method of claim 36, wherein said dopants are selected from the group consisting of Ce, Cr, Co, Fe, Ca, Mn, Mo, Mg, Rh, all other suitable rare earth ions, and transition metal ions.

38. An optical switch comprising;
   a photorefractive ferroelectric material storing at least one hologram; and
   a means for selectively activating said hologram by using an applied electric field during readout to increase the diffraction efficiency of said hologram; and
   means for maintaining said photorefractive ferroelectric material at a temperature in the vicinity of or above the ferroelectric phase transition temperature during readout.

39. The optical switch according to claim 38, wherein said means for activating said hologram(s) comprises a voltage source connected to said holographic material, wherein applying a sufficient voltage produces an electric field that activates said hologram(s).

40. The optical switch according to claim 38, wherein said holograms are fixed in said material.

41. The optical switch according to claim 38, wherein said material is operated at a temperature in the vicinity of or above the Curie temperature of said material.

42. An integrated optical interconnection switch comprising:
   a plurality of holograms stored in a ferroelectric photorefractive medium,
   said medium having a plurality of optical waveguides, with said holograms stored along said waveguides,
   said medium being maintained at a temperature in the vicinity of or above the ferroelectric phase transition temperature during readout,
   and an electric field selectively applied to said holograms during readout for selectively activating at least one of said holograms to diffract light from one waveguide into another waveguide.

43. The integrated optical interconnection switch of claim 42, wherein said recording medium is a doped ferroelectric, said ferroelectric selected from the group consisting of SBN $(Sr_xBa_{1-x}Nb_2O_6)$, BSKNN $(Ba_{2-x}Sr_xK_{1-y}Nb_5O_{15})$, BSTN $(Ba_{3-x}Sr_xTiNb_4O_{15})$, SCNN $(Sr_{2-x}Ca_xNaNb_5O_{15})$, PBN $(Pb_xBa_{1-x}Nb_2O_6)$, $LiNbO_3$, $BaTiO_3$, $KnbO_3$, KTN $(Kta_{1-x}Nb_xO_3)$, PLZT, and other ferroelectrics having a tungsten bronze crystal structure.

44. The integrated optical interconnection switch of claim 42, wherein said recording medium is a ferroelectric crystal, and said electric field is applied along the polar axis of said crystal.

45. The integrated optical interconnection switch of claim 42, wherein said holograms are fixed in said material.

46. The integrated optical interconnection switch of claim 42, wherein said material is operated at a temperature in the vicinity of or above the Curie temperature of said material.

47. The integrated optical interconnection switch of claim 42, wherein said optical waveguides form a plurality of waveguides that intersect with one another and said holograms are recorded at said intersections.

48. A free-space optical interconnection switch, comprising:
   a plurality of holograms stored in a ferroelectric photorefractive medium, said medium being maintained at a temperature in the vicinity of or above the ferroelectric phase transition temperature during readout; and,
   an electric field selectively applied to said holograms during readout for selectively activating at least one of said holograms to diffract light from an input free-space optical channel to one or more output free-space channels.

49. The free-space optical interconnection switch of claim 48, wherein said recording medium is a doped ferroelectric, said ferroelectric selected from the group consisting of SBN $(Sr_xBa_{1-x}Nb_2O_6)$, BSKNN $(Ba_{2-x}Sr_xK_{1-y}Nb_5O_{15})$, BSTN $(Ba_{3-x}Sr_xTiNb_4O_{15})$, SCNN $(Sr_{2-x}Ca_xNaNb_5O_{15})$, PBN $(Pb_xBa_{1-x}Nb_2O_6)$, $LiNbO_3$, $BaTiO_3$, $KnbO_3$, KTN $(Kta_{1-x}Nb_xO_3)$, PLZT, and other ferroelectrics having a tungsten bronze crystal structure.

50. The free-space optical interconnection switch of claim 48, wherein said recording medium is a ferroelectric crystal, and said electric field is applied along the polar axis of said crystal.

51. The free-space optical interconnection switch of claim 48, wherein said holograms are fixed in said material.

52. The free-space optical interconnection switch of claim 48, wherein said material is operated at a temperature in the vicinity of or above the Curie temperature of said material.

53. The free-space optical interconnection switch of claim 48, wherein said plurality of holograms are multiplexed in said material.

54. The free-space optical interconnection switch of claim 48, wherein said interconnection holograms are recorded by light modulated by spatial light modulators, and said holograms are used to route optical signals to a photodetector array.

55. A dynamic optical wavelength filter comprising:
   a plurality of holograms stored in a ferroelectric photorefractive material, each said hologram active to a state of increased diffraction efficiency by the application of an electric field during readout, and said material being maintained at a temperature in the vicinity of or above the ferroelectric phase transition temperature during readout,
   wherein predetermined wavelengths of light may be selectively diffracted by at least one of said selectively activated holograms.

56. The optical filter of claim 55, wherein said recording medium is a doped ferroelectric, said ferroelectric selected from the group consisting of SBN $(Sr_xBa_{1-x}Nb_2O_6)$, BSKNN $(Ba_{2-x}Sr_xK_{1-y}Nb_5O_{15})$, BSTN $(Ba_{3-x}Sr_xTiNb_4O_{15})$, SCNN $(Sr_{2-x}Ca_xNaNb_5O_{15})$, PBN $(Pb_xBa_{1-x}Nb_2O_6)$, $LiNbO_3$, $BaTiO_3$, $KnbO_3$, KTN $(Kta_{1-x}Nb_xO_3)$, PLZT, and other ferroelectrics having a tungsten bronze crystal structure.

57. The optical filter of claim 55, wherein said recording medium is a ferroelectric crystal, and said electric field is applied along the polar axis of said crystal.

58. The optical filter of claim 55, wherein said holograms are fixed in said material.

59. The optical filter of claim 55, wherein said material is operated at a temperature in the vicinity of or above the Curie temperature of said material.

60. The optical filter of claim 55, wherein each said hologram is Bragg matched by a specific wavelength such that activation of said hologram causes incoming light within a narrow spectral band centered about the corresponding Bragg-matched wavelength to be diffracted to a photodetector or other form of output channel; those holograms that are not activated produce little or no diffraction.

61. The optical filter of claim 60, wherein said holograms provide dynamic wavelength demultiplexing by diffracting light of different wavelengths (or narrow wavelength bands) into different predetermined output channels.

62. A holographic data storage system comprising:
   a plurality of holograms stored in a ferroelectric photorefractive material, each said hologram is fixed in said material and activated to a state of increased diffraction efficiency by the application of an electric field to said material during readout, and said material being maintained at a temperature in the vicinity of or above the ferroelectric phase transition temperature during readout.

63. The holographic data storage system of claim 62, wherein said recording medium is a doped ferroelectric, said ferroelectric selected from the group consisting of SBN ($Sr_xBa_{1-x}Nb_2O_6$), BSKNN ($Ba_{2-x}Sr_xK_{1-y}Nb_5O_{15}$), BSTN ($Ba_{3-x}Sr_xTiNb_4O_{15}$), SCNN ($Sr_{2-x}Ca_xNaNb_5O_{15}$), PBN ($Pb_xBa_{1-x}Nb_2O_6$), $LiNbO_3$, $BaTiO_3$, $KnbO_3$, KTN ($Kta_{1-x}Nb_xO_3$), PLZT, and other ferroelectrics having a tungsten bronze crystal structure.

64. The holographic data storage system of claim 62, wherein said recording medium is a ferroelectric crystal, and said electric field is applied along the polar axis of said crystal.

65. The holographic data storage system of claim 62, wherein said material is operated at a temperature in the vicinity of or above the Curie temperature of said material.

66. The holographic data storage system of claim 62, further comprising:

spatial light modulators to optically encode two-dimensional binary bit patterns in the form of amplitude and/or phase patterns, and wherein said holograms storing data represent said binary bit patterns.

67. The holographic data storage system of claim 66, wherein said ferroelectric material is a rod, and a plurality of such rods are embedded in a material having a lower index of refraction than said rods.

68. A recording and reconstruction cycle for a hologram stored in a ferroelectric photorefractive medium comprising:

exposing said ferroelectric photorefractive medium to an optical interference pattern so as to record a hologram therein, fixing said hologram in said medium to substantially maintain the diffraction efficiency during readout, and, applying an electric field to said medium during readout to increase the diffraction efficiency of said hologram while maintaining said medium at a temperature in the vicinity of or above the ferroelectric phase transition temperature during readout.

69. The method of recording and reconstructing a hologram according to claim 68, wherein fixing said interference pattern is achieved by elevating the temperature of said medium.

70. The method of recording and reconstructing a hologram according to claim 69, wherein said elevation of temperature is in the range of 50° to 250 ° C., and said medium is exposed to said interference pattern before said elevation of temperature.

71. The method of recording and reconstructing a hologram according to claim 69, wherein said fixing is achieved by the use of a dopant ion.

72. The method of recording and reconstructing a hologram according to claim 71, wherein said ion is a proton, and said proton is introduced into the said medium by placing said medium in a chamber containing water vapor or any other suitable source of protons and heating said chamber to a temperature in the range of 700° to 1200° C.

73. The method of recording and reconstructing a hologram according to claim 68, wherein said hologram is fixed by cooling said medium through a solid-solid phase transition to deactivate at least one photorefractive impurity center.

74. The method of recording and reconstructing a hologram according to claim 68, wherein said hologram is fixed by utilizing a two-photon charge transfer excitation.

75. The method of recording and reconstructing a hologram according to claim 68, wherein said hologram is fixed by using a readout beam that has a wavelength in a spectral region for which the said recording medium is not photosensitive.

76. The method of recording and reconstructing a hologram according to claim 68, wherein said recording medium is a ferroelectric crystal, and said electric field is applied along the polar axis of said crystal.

* * * * *

UNITED STATES PATENT AND TRADEMARK OFFICE
CERTIFICATE OF CORRECTION

PATENT NO. : 5,684,612
DATED : November 4, 1997
INVENTOR(S) : Jeffrey P. Wilde, Lambertus Hesselink It is certified that error appears in the above-identified patent and that said Letters Patent is hereby corrected as shown below:

Front page, title, 3rd line, change "HOLOGAMS", to read --HOLOGRAMS--.
Column 1, title, 3rd line, change "HOLOGAMS", to read --HOLOGRAMS--.
Column 13, claim 7, line 16, change "one or more", to read --at least one--.
Column 13, claim 10, line 24, change "claim 10", to read --claim 1--.
Column 14, claim 20, line 4, change "centers", to read --center--.
Column 14, claim 36, line 65, after "doped with", add --at least one--
Column 17, claim 68, line 38, delete "diffraction efficiency", replace with --space-charge field--.
Column 18, claim 74, line 34, after "which", delete "the".

Signed and Sealed this

Twenty-first Day of April, 1998

Attest:

BRUCE LEHMAN

*Attesting Officer*   *Commissioner of Patents and Trademarks*